United States Patent [19]

Elward, Jr.

[11] Patent Number: 4,751,458
[45] Date of Patent: Jun. 14, 1988

[54] TEST PADS FOR INTEGRATED CIRCUIT CHIPS

[75] Inventor: John P. Elward, Jr., Berkeley Heights, N.J.

[73] Assignee: American Telephone and Telegraph Company, AT&T Bell Laboratories, Murray Hill, N.J.

[21] Appl. No.: 780,714

[22] Filed: Sep. 27, 1985

Related U.S. Application Data

[62] Division of Ser. No. 595,970, Apr. 2, 1984, abandoned.

[51] Int. Cl.[4] .......................................... G01R 31/26
[52] U.S. Cl. .................................. 324/158 F; 357/65
[58] Field of Search ............ 324/158 R, 158 F, 158 P, 324/73 PC; 29/574; 357/65, 68, 71

[56] References Cited

U.S. PATENT DOCUMENTS

| | | | |
|---|---|---|---|
| 3,617,818 | 11/1971 | Fuller | 357/68 X |
| 3,974,443 | 8/1976 | Thomas | 324/158 R |
| 4,063,274 | 12/1977 | Dingwall | 357/68 |
| 4,167,748 | 9/1979 | D'Angelo | 357/68 |
| 4,242,698 | 12/1980 | Ghate et al. | 357/68 |

FOREIGN PATENT DOCUMENTS

| | | | |
|---|---|---|---|
| 14557 | 2/1978 | Japan | 357/71 R |
| 145478 | 12/1978 | Japan | 29/574 |
| 112174 | 9/1979 | Japan | 29/574 |
| 119875 | 9/1979 | Japan | 29/574 |
| 23437 | 2/1980 | Japan | 324/158 P |
| 12744 | 2/1981 | Japan | 324/158 P |
| 106045 | 7/1982 | Japan | 29/574 |
| 15251 | 1/1983 | Japan | 29/574 |
| 158938 | 9/1983 | Japan | 29/574 |
| 2061617 | 5/1981 | United Kingdom | 357/71 R |

OTHER PUBLICATIONS

Beldring et al, "Fiber Optic Sensor for Testing and Sorting Semiconductor Devices", Western Electric Technical Digest, No. 33, Jan. 1974, pp. 11-12.

Primary Examiner—Reinhard J. Eisenzopf
Assistant Examiner—Stephen M. Baker
Attorney, Agent, or Firm—Lucian C. Canepa

[57] ABSTRACT

Integrated circuit chips included on a wafer typically include multiple internal test pads. During diagnostic testing of the wafer, a fine-point test probe is utilized to contact the pads. As feature sizes decrease, the task of consistently and reliably probing very-small-area internal test pads becomes increasingly difficult and time-consuming. In accordance with a feature of the present invention, each internal test pad on a chip is designed to include an interior opening. This provides a continuous interior edge which reliably limits sliding of an inserted tip while ensuring good electrical contact between the tip and the pad being probed.

2 Claims, 1 Drawing Sheet

TEST PADS FOR INTEGRATED CIRCUIT CHIPS

This application is a division of application Ser. No. 595,970 filed Apr. 2, 1984, now abandoned.

This invention relates to testing integrated circuit chips and, more particularly, to a chip structure that includes uniquely configured internal test pads.

For diagnostic testing purposes during the design and development of an integrated circuit chip, it is common practice to include internal test pads on the chip. By means of a test probe mounted in a standard micromanipulator, direct electrical contact can be made to these internal pads. This permits electrical probing of internal circuit points that are not directly accessible from the conventional peripherally disposed bonding pads typically included on the chip.

Diagnostic testing utilizes a standard micromanipulator for probe positioning control and a microscope for viewing the internal pads to be contacted. The viewing requirement necessitates that the longitudinal axis of the probe be oriented nonorthogonally with respect to the surfaces of the pads. Accordingly, considerable care must be exercised to prevent the probe point from completely sliding off the generally smooth pad surfaces.

The advance of technology to smaller and smaller feature sizes of several micrometers and below makes it increasingly difficult to probe the standard very-small-area internal pads included on such chips. The tendency of the probe point to slide across the surface of a pad makes it extremely tedious and time-consuming to ensure good electrical contact between the probe point and the surface of a very-small-area pad.

A typical fine-line integrated circuit chip may include hundreds of such very-small-area internal pads to be probed. For such a chip, the task of reliably contacting the pads during diagnostic testing may therefore constituted an inordinately expensive operation.

Accordingly, efforts have been directed by workers in the art aimed at trying to improve the aforedescribed testing operation. It was recognized that such efforts, if successful, had the potential of significantly decreasing the time required to detect and correct design and/or processing errors and therefore of substantially lowering the cost of developing fine-line integrated circuits.

SUMMARY OF THE INVENTION

Hence, an object of the present invention is an improved method for diagnostic testing of integrated circuit chips. More specifically, an object of this invention is an improved chip structure that includes uniquely configured internal test pads.

Briefly, these and other objects of the present invention are realized in an embodiment thereof that comprises a fine-line integrated circuit chip including very-small-area internal test pads. In accordance with the invention, each such internal pad is formed to include an interior recess that provides a continuous internal edge. The point of a test probe inserted into the recess is thereby certain to come into contact with some portion of the internal edge.

In accordance with applicant's invention, an integrated chip structure comprises a conductive pattern formed on an insulating layer. In one specific illustrative embodiment of the invention, the pattern comprises at least one internal test pad that includes an interior opening having a continuous internal edge.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
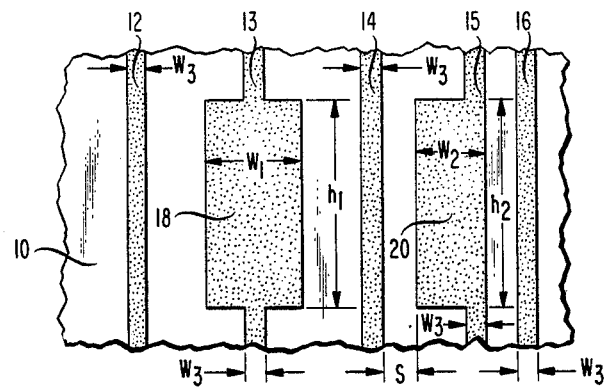
FIG. 1 is a top view of a portion of a standard integrated circuit chip that includes two conventional internal test pads.

The standard chip portion depicted in FIG. 1 comprises a conventional partially fabricated multilayered integrated circuit structure. Only two layers of the structure are explicitly shown in FIG. 1. These layers comprise an insulating layer 10 on which is formed a patterned conducting layer. By way of example, the patterned conducting layer comprises a single metallic film such as aluminum or a two-film structure such as aluminum-on-doped polycrystalline silicon. These and other conventional conductive structures suitable for use in fabricating integrated circuit chips are well known in the art.

The patterned layer shown in FIG. 1 includes five conductive runners 12 through 16. Two of these runners have enlarged sections 18 and 20 which constitute so-called internal test pads that remain a permanent part of the final chip structure to be manufactured. These pads are designed to be contacted by a fine-point test probe during diagnostic testing. After such testing, the fabrication of the chip structure may be completed by following standard steps including covering the depicted surfaces with a suitable cap layer made, for example, of silicon nitride. Or if such diagnostic testing reveals faults or insufficient margins in the design or processing of the chip, a modified design or a modified fabrication procedure will thereby be indicated.

The inclusion in an integrated circuit chip of multiple internal test pads such as the pads 18 and 20 of FIG. 1 does not dictate the chip layout or affect the overall size of the chip. This is because, in an actual design, multiple open areas typically already exist on the top surface of the layer 10 within the conductive pattern formed theron. In most cases, the desired internal test pads can simply be placed within these areas without necessitating any redesign of the chip.

During the course of attempting to bring the point of a test probe into contact with the surfaces of internal test pads 18 and 20 of FIG. 1, special care must be exercised in practice to insure an electrical connection between the probe and a specified pad. The difficulty of achieving such connections is evident when one considers the small dimensions of the depicted pads. In one actual illustrative integrated circuit chip design, the width $w_1$ and height $h_1$ of the surface of the internal test pad 18 were only about 15 micrometers and 37 micrometers, respectively. In that same design, the width $w_2$ and height $h_2$ of the surface of the pad 20 were only about 9 micrometers and 37 micrometers, respectively. The width $w_3$ of each of the runners 12 through 16 was only about 3.5 micrometers. Moreover, the spacings between the edges of the pads 18 and 20 and the edges of adjacent runners were exceedingly small. Thus, for example, in the particular design depicted in FIG. 1, the spacing s between the left-hand edge of the pad 20 and the right-hand edge of the runner 14 was only about 5 micrometers.

A typical standard probe utilized to contact the aforedescribed internal test pads is made, for example, from 10-micrometer-diameter tungsten wire. Illustratively, the contacting or free end of the wire probe is formed as a tapered point whose extreme end is approximately 1.5-to-2 micrometers in diameter. In practice, such a fine-point probe tends almost always to initially slide or skate across a generally smooth surface such as the surfaces of the internal test pads 18 and 20 shown in FIG. 1. Only by exercising extreme care can an operator be reasonably certain that the probe point will not entirely slide off the surface of the test pad intended to be contacted. If the probe point does so slide off a pad surface, it may come to rest at a point on the surface of the insulating layer 10. Or the probe may slide off a pad surface and come to rest in contact with an adjacent runner or may actually short-circuit two adjacent runners. In any of these cases, the intended contact between probe and test pad will not have been made. Only by careful and extremely time-consuming manipulations can the test operator be reasonably certain that these undesirable eventualities do not occur.

Figure 2:
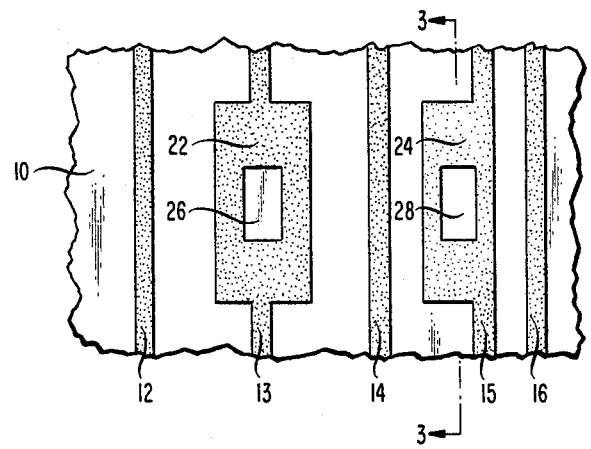
FIG. 2 is a top view of a portion of an integrated circuit chip that includes two specific illustrative internal test pads made in accordance with the principles of the present invention.

In accordance with one specific feature of the principles of applicant's invention, each of the internal test pads on an integrated circuit chip is formed, for example, to include an interior opening. Two such pads 22 and 24 are shown in FIG. 2. The pad 22 includes an opening 26 that is rectangular in cross-section, and the pad 24 includes a rectangular opening 28. Other portions of the chip structure shown in FIG. 2 are identical to corresponding portions of FIG. 1 and are accordingly identified with the same reference numerals employed in FIG. 1.

The configurations of the interior openings 26 and 28 (FIG. 2) formed in the depicted test pads are not critical. Thus, for example, circular or oval configurations, or other configurations, are also suitable for the interior openings. What is important is that the interior opening, whatever its geometry, provide a continuous inner edge within each test pad. In that way, a probe point inserted within the interior opening to contact the underlying surface in sliding engagement will inevitably come to rest in contact with a portion of the inner edge of the interior opening. And this is so regardless of the direction from which an inclined (nonorthogonally disposed) probe enters the interior opening. Importantly, this gives a manipulator of the probe complete freedom of direction in devising a maximally effective probing routine.

Illustratively, the specific exemplary rectangular openings 26 and 28 shown in FIG. 2 each measure about 4 micrometers by 8 micrometers. But any opening size conveniently large enough to receive a probe point may be suitable to achieve the meritorious results of applicant's invention.

The openings 26 and 28 shown in FIG. 2 are easily achieved during etching of the herein-specified metallization layer of a chip structure. By employing, for example, conventional dry etching techniques such as reactive sputter (or ion) etching, vertically walled openings having the specified dimensions are realized.

The exposed surface within each of the interior openings 26 and 28 shown in FIG. 2 typically constitutes a portion of the surface of the insulating layer 10. Illustratively, the layer 10 is approximately 1.5 micrometers thick. Advantageously, the layer 10 is formed in a standard chemical-vapor-deposition step from a source comprising tetraethylorthosilicate and triethylphosphite. The resulting conventional material is commonly referred to as PTEOS glass. In practice, such a glass layer has a smooth top surface which is not deleteriously affected by being contacted with a standard fine-point test probe.

Figure 3:
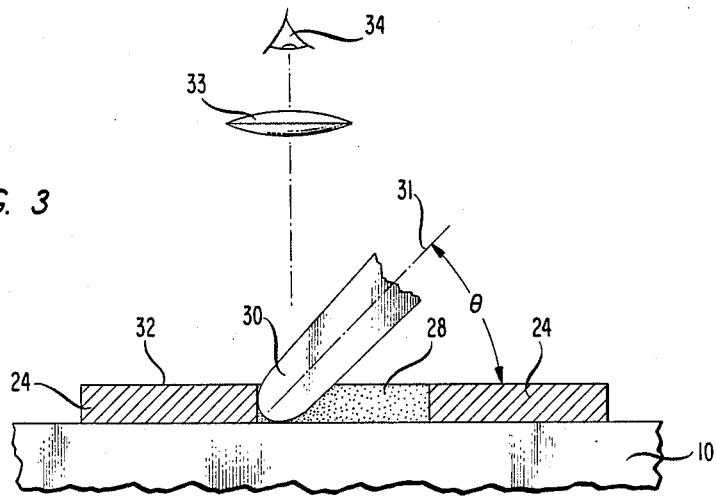
FIG. 3 is a cross-sectional representation of one of applicant's internal test pads, as viewed along lines 3 of FIG. 2, with a portion of a test probe shown positioned within an interior opening of the pad in contact with an inner wall of the pad.

FIG. 3 shows a portion of a test probe 30 inserted within the interior opening 28 of the previously described internal test pad 24. By way of example, the test pad 24 is patterned from an aluminum layer about one micrometer thick.

The free end of the test probe 30 is shown in FIG. 3 in contact with an inner edge of the interior opening 28 formed in the test pad 24. Additionally, the end of the probe 30 is also shown to be in contact with a portion of the top surface of the layer 10. The depicted position of the probe 30 within the opening 28 results in the establishment of a good electrical connection between the probe 30 and the test pad 24.

The longitudinal axis 31 (FIG. 3) of the probe 30 is typically oriented nonorthogonally with respect to the top surface 32 of the pad 24. Such an orientation facilitates the ability of a test operator 34 to view the pad to be contacted through a microscope 33 associated with a standard probe station. Illustratively, the angle $\theta$ shown in FIG. 3 is in practice selected to be in the range of about 30-to-45 degrees.

During diagnostic testing, an operator initially directs the end of the probe 30 (FIG. 3) to contact the top surface of the layer 10 at or near the center of the interior opening in the pad 24. In practice, the end of the probe then slides across the surface of the layer 10 and comes to rest in the stable electrically contacting position shown in FIG. 3.

It is to be understood that the above-described arrangements and techniques are only illustrative of the principles of the present invention. In accordance with these principles, numerous modifications and alternatives may be devised by those skilled in the art without departing from the spirit and scope of the invention. Thus, for example, in some chip designs it may be feasible and advantageous to include more than one interior opening per internal test pad. Additionally, it is apparent that the openings described herein, such as the openings 26 and 28, may in concept constitute only depressions in the internal test pads rather than apertures that extend completely through the conductive layer overlying the insulating layer 10. But, in practice, the entire conductive layer is advantageously patterned in a single batch etching operation in which unwanted conductive material, including such material within the openings 26 and 28, is totally removed. But if the unwanted conductive material outside the openings is in fact totally removed before all the conductive material within the "openings" is, no overetching for the sole purpose of clearing the openings down to the surface of the layer 10 is necessarily required. Also, although it typically complicates the patterning operation, in some cases involving a two-film metallization it may be advantageous to not etch the bottom film within the openings 26 and 28. In those cases, the end of an inserted probe will be in electrical engagement with both an inner conductive wall and a bottom conductive surface of the test pad.

What is claimed is:

1. For use in manufacturing an integrated circuit chip structure of the type that includes a conductive pattern formed on an insulating layer, the pattern including at least one test pad which comprises an interior recessed portion having a continuous internal edge, a method comprising the step of inserting the point of an inclined test probe into said interior portion from any direction to slide said point across the bottom surface of said portion into electrical contact with the internal edge of said pad;

wherein the longitudinal axis of said probe is oriented at an angle of approximately 30-to-45 degrees with respect to the surface of said pad;

wherein said test pad is located away from the edges of said chip structure in an interior region of the structure;

wherein said portion comprises an interior opening in said pad;

and wherein the interior opening in said pad reveals a portion of the surface of said insulating layer.

2. A method as in claim 1 wherein the internal edge of said interior opening is substantially vertical.

* * * * *